United States Patent
Chen et al.

(10) Patent No.: US 7,462,833 B2
(45) Date of Patent: Dec. 9, 2008

(54) MULTI-FUNCTIONAL CATHODE PACKAGING DESIGN FOR SOLID-STATE RADIATION DETECTORS

(75) Inventors: Henry Chen, Victoria (CA); Pinghe Lu, Surrey (CA); Ray Brougham, Victoria (CA); Salah Awadalla, Victoria (CA); Andrew MacDonald, Victoria (CA); Glenn Bindley, West Vancouver (CA)

(73) Assignee: Redlen Technologies, Sidney, British Columbia (CA)

( * ) Notice: Subject to any disclaimer, the term of this patent is extended or adjusted under 35 U.S.C. 154(b) by 0 days.

(21) Appl. No.: 11/785,319

(22) Filed: Apr. 17, 2007

(65) Prior Publication Data

US 2008/0258066 A1    Oct. 23, 2008

(51) Int. Cl.
*G01T 1/24* (2006.01)
(52) U.S. Cl. .................................. 250/370.01
(58) Field of Classification Search ............ 250/370.01, 250/370.02, 370.03, 370.04, 370.05, 370.06, 250/370.07, 370.08, 370.09, 270.1, 370.11, 250/370.12, 370.13, 370.14, 370.15
See application file for complete search history.

(56) References Cited

U.S. PATENT DOCUMENTS

| | | | | |
|---|---|---|---|---|
| 4,301,368 | A | * | 11/1981 | Riihimaki ............... 250/385.1 |
| 4,858,856 | A | * | 8/1989 | Cloth ........................ 244/149 |
| 5,608,188 | A | * | 3/1997 | Choon et al. ............... 174/372 |
| 5,677,539 | A | | 10/1997 | Apotovsky et al. |
| 5,905,264 | A | | 5/1999 | Shahar et al. |
| 5,933,706 | A | | 8/1999 | James et al. |
| 6,034,373 | A | | 3/2000 | Shahar et al. |
| 6,037,595 | A | | 3/2000 | Lingren |
| 6,043,106 | A | | 3/2000 | Mescher et al. |
| 6,046,068 | A | | 4/2000 | Orava et al. |
| 6,069,360 | A | | 5/2000 | Lund |
| 6,175,120 | B1 | | 1/2001 | McGregor et al. |
| 6,215,123 | B1 | | 4/2001 | Orava et al. |
| 6,333,504 | B1 | | 12/2001 | Lingren et al. |
| 6,410,922 | B1 | | 6/2002 | Spartiotis et al. |
| 6,524,966 | B1 | | 2/2003 | Wright et al. |
| 6,765,213 | B2 | | 7/2004 | Shahar et al. |
| 6,781,132 | B2 | | 8/2004 | McGregor |
| 7,038,288 | B2 | | 5/2006 | Lai et al. |
| 7,247,860 | B2 | | 7/2007 | Yanagita et al. |
| 2001/0035497 | A1 | | 11/2001 | Montemont et al. |
| 2002/0066531 | A1 | | 6/2002 | Ke et al. |

(Continued)

FOREIGN PATENT DOCUMENTS

EP    1 156 347 A1    11/2001

(Continued)

OTHER PUBLICATIONS

U.S. Appl. No. 11/527,707, filed Sep. 27, 2006, Chen et al.

(Continued)

*Primary Examiner*—David P. Porta
*Assistant Examiner*—Kiho Kim
(74) *Attorney, Agent, or Firm*—Foley & Lardner LLP

(57) ABSTRACT

A radiation detector includes a semiconductor substrate with opposing front and rear surfaces, where a cathode electrode is located on the front surface, a plurality of anode electrodes located on the rear surface, and an electrically conductive housing is placed in electrical contact with the cathode electrode.

36 Claims, 5 Drawing Sheets

U.S. PATENT DOCUMENTS

| | | |
|---|---|---|
| 2002/0182716 A1 | 12/2002 | Weisbuch et al. |
| 2003/0034456 A1* | 2/2003 | McGregor ............. 250/370.09 |
| 2005/0199816 A1* | 9/2005 | Amemiya et al. ...... 250/363.05 |
| 2006/0186501 A1 | 8/2006 | Ishimura |
| 2007/0194243 A1 | 8/2007 | Chen et al. |

FOREIGN PATENT DOCUMENTS

| | | |
|---|---|---|
| JP | 02129969 A * | 5/1990 |
| JP | 11-163310 A | 6/1999 |
| JP | 2005-257437 A | 9/2005 |
| JP | 2006-237186 A | 9/2006 |

OTHER PUBLICATIONS

U.S. Appl. No. 11/633,091, filed Dec. 4, 2006, Chen et al.
U.S. Appl. No. 11/642,819, filed Dec. 21, 2006, Chen et al.

* cited by examiner

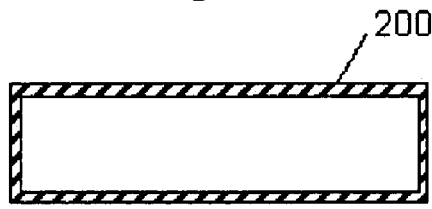
Fig. 2A
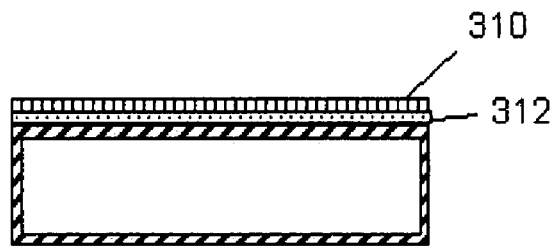
Fig. 2B
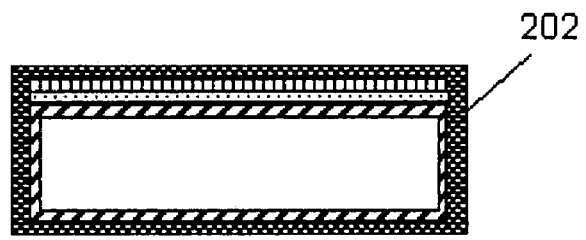
Fig. 2C
Fig. 2D
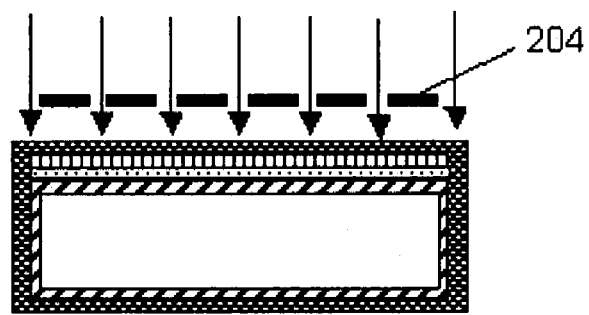
Fig. 2E

MULTI-FUNCTIONAL CATHODE PACKAGING DESIGN FOR SOLID-STATE RADIATION DETECTORS

BACKGROUND OF THE INVENTION

The present invention generally relates to detectors for gamma-ray and X-ray detection devices.

SUMMARY OF THE INVENTION

One embodiment of the invention relates to a radiation detector comprising a semiconductor substrate having opposing front and rear surfaces, a cathode electrode located on the front surface of said semiconductor substrate, a plurality of anode electrodes on the rear surface of said semiconductor substrate and an electrically conductive housing placed in electrical contact with the cathode electrode.

Another embodiment relates to a method of making a radiation detector comprising the steps of (a) providing the detector comprising a semiconductor substrate having opposing front and rear surfaces, a cathode electrode located on the front surface of said semiconductor substrate and a plurality of anode electrodes on the rear surface of said semiconductor substrate (b) providing a separately formed electrically conductive housing and (c) attaching the housing to the cathode electrode such that the housing and the cathode electrode are in electrical contact.

Finally, another embodiment relates to a housing for a radiation detector comprising a first means for electrically contacting a cathode electrode of a semiconductor radiation detector and a second means for shielding at least one side of a semiconductor substrate of the radiation detector.

BRIEF DESCRIPTION OF THE DRAWINGS

FIGS. 2A-I are schematic cross-sectional views of a method of making a detector at various stages in the formation of contacts thereon.

DETAILED DESCRIPTION OF THE PREFERRED EMBODIMENTS

Figure 1:
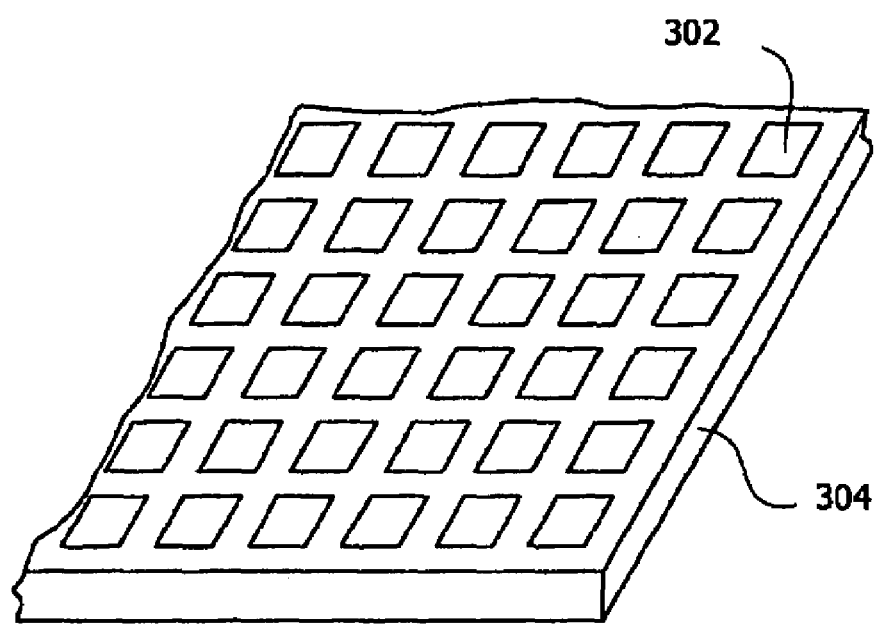
FIG. 1 is a perspective view of a CZT substrate with anode electrode pixels.

The following definitions are used herein:

Cathode electrode: the electrode on one major surface of the detector substrate where incident gamma rays or x-rays enter the detector, i.e. positioned towards the radiation source.

Anode electrodes: segmented electrode contacts located on the rear surface of the substrate, i.e. positioned away from the radiation source.

Interpixel or inter pixel: the region or gap separating pixel electrodes. For electrode configurations with non-pixellated discrete contact segments the term is equivalently applied to the gap between contact segments.

Solder mask: a coating on the semiconductor detector or on the printed circuit board ("PCB"), which is designed to insulate and protect either the segmented anode (pixels) on the semiconductor detector or the mating metal pads on the PCB, keeping them from shorting during PCB-attachment process. The solder mask may have any suitable color, such as a dark green/blue color and occasionally a yellowish color.

Embodiments of the present invention describe radiation detectors comprising a multi-functional housing (i.e. packaging.) In one embodiment, a radiation detector comprises a semiconductor substrate having opposing front and rear surfaces, a cathode electrode located on the front surface of said semiconductor substrate, a plurality of anode electrodes on the rear surface of said semiconductor substrate and an electrically conductive housing placed in electrical contact with the cathode electrode.

In one aspect, the housing provides a mechanically protective layer for the radiation detector, specifically for the cathode electrode and corners/edges of the detector. In another aspect, the housing provides an excellent mating surface for connecting to a voltage source, such as a high bias voltage port. In another aspect, the housing shields the detector from background electro-magnetic (or magnetic) fields. In yet another aspect, the housing improves performance of the edge pixels via a focusing effect and reduces current leakage therefrom.

Radiation detectors can be configured in a variety of ways. A common configuration comprises a cathode electrode and a plurality of anode electrodes located on opposite sides of a semiconductor plate or substrate. Typically these radiation detectors have pixilated anode electrode arrays fabricated by various deposition and lithography processes resulting in a gap between pixels, termed the interpixel gap or interpixel region.

In the preferred embodiments, the radiation detectors comprise a semiconductor material, such as a semiconductor material preferably comprising CdZnTe (CZT) or CdTe. Although other types of semiconductor materials exemplified by lead iodide, thallium bromide, gallium arsenide or silicon may be used.

More preferred is $Cd_{(1-x)}Zn_xTe$ (where x is less than or equal to 0.5), a wide band gap ternary II-VI compound semiconductor with unique electronic properties. This type of semiconductor is useful in gamma-ray and X-ray detectors which are used as spectrometers that operate at room temperature for nuclear radiation detection, spectroscopy and medical imaging applications.

Illustrated in FIG. 1, is an example of pixellated anode electrodes 302 formed on a semiconductor substrate 304, such as a CZT substrate (also referred to as a "tile"). The cathode electrode is formed on the bottom side of the substrate 304.

FIGS. 2A-I illustrate, without any intent to limit the present embodiments, an example of steps in method of forming tri-layer metal contacts on a semiconductor substrate at positions (pixels) for defining radiation detector cells with an interpixel gap with high resistivity between the detector cells. In this example, it is assumed that the semiconductor substrate is made of cadmium zinc telluride (CdZnTe) or cadmium telluride (CdTe), although it will be appreciated that other semiconductor materials, for example lead iodide, thallium bromide, gallium arsenide or silicon, can be used. Also, it will be assumed that the metal used for the metallization layer and the contacts is gold, although it will be appreciated that other metals, alloys or other conductive materials, for example platinum or indium, could be used.

Thus, FIGS. 2A-2I are a schematic cross-sectional views from the side of a detector substrate at various stages in the formation of gold contacts on a CdZnTe substrate. The detailed features and structure at each step of the process are shown, resulting in an array of anode contact pixels on the rear surface of the CZT (drawn as facing up in this illustration), and a single cathode electrode on the front surface of the CZT tile (drawn as facing down in this illustration). In this example, two additional contact layers are added on to the pixilated primary contact layer on the rear side, for improved device assembly. The process can be applied to any array size and pixel configuration for CZT devices. A typical device size is a 20×20×5 mm detector, having 8×8 pixels or 11×11 pixels depending on the application. As a precursor to contact fabrication, the CZT wafer is polished and etched such that high quality clean crystal surfaces are prepared for the deposition process.

The direct lithography fabrication process is described with reference to FIGS. 2A-I, and for the case of the primary contact being gold, with two additional contact layers, and for simultaneous forming of the cathode contact on the opposing side of the CZT tile or substrate 304 shown in FIG. 2A.

In step 1, shown in FIG. 2B a primary layer of gold 200 is deposited on the CZT tile 304. The gold layer 200 may be deposited by electroless deposition. Alternatively the gold layer 200 may be deposited by other known techniques, such as sputtering. The CZT tiles are first cleaned in acetone, as is well known. The clean CZT tiles 304 are dipped in an electroless gold solution for several minutes depositing a gold layer 200, then the tile is removed and rinsed with methanol. Typical thickness of deposition is equal or more than 100 nm. The deposited gold may be annealed at 90 deg C. for 15 minutes to increase adhesion to the substrate. An adhesion test can be done after a few hours using Scotch tape to confirm quality of the adhesion.

In an optional step 2 shown in FIG. 2C, two additional contact layers are deposited onto the rear side (anode side to be pixilated) of the tile, over the primary contact layer 200 on the rear side. In this example, a Ni layer 312 is deposited using sputtering or a thermal evaporation process to a thickness <100 nm and nominally 50 nm. Then another gold layer 310 is deposited using sputtering, thermal evaporation and/or an electroless process to a thickness <50 nm and nominally 20 nm. Alternative conductive contact material can be substituted for either or both of the additional contact layers.

In step 3, as shown in FIG. 2D, a photoresist 202 is applied over the contact layer(s). Tiles 304 are dipped in resist, for example Shipley 1805 resist. Excessive resist is removed if necessary from the edge using a Q-tip, making sure the resist does not form any edge bead (especially on the pixilated face) as this would be detrimental for the pixel quality. Generally, the least possible amount of resist should remain on the pixilated face. The resist should be dried out for 10 minutes with the pixilated face kept up and horizontal.

The resist coating is hardened in step 4 by baking for 10 minutes at 90° C. This step is done to drive excess solvent out of the resist. The tile is now prepared for lithography exposure.

In step 5, as shown in FIG. 2E a pixel pattern is formed on the rear side of the tile 304 by photolithography. A UV mask 204 is aligned over the CZT tile surface, and the positive resist is exposed to UV. The direct lithography mask shades regions of the resist in a selected pixel pattern and exposes interpixel gaps to UV radiation. A contact mask is shown but other methods will work as well, such as proximity and projection masks. A glass plate is placed on top making sure that the glass plate is horizontal. This ensures uniform contact between the tile and the mask. For the exemplary resist, exposure by a UV lamp (365 nm wavelength) for several minutes is suitable. If desired, a negative resist may be used instead of the positive resist (in which case, the exposure mask's transparent and opaque regions are reversed).

Figure 2F:
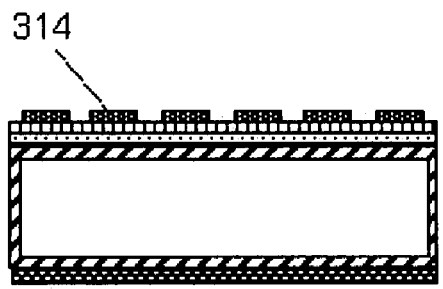

In step 6 shown in FIG. 2F, the exposed photoresist is developed. The resist developer (for example Microposit developer, MF-319) should cover the tile(s). The tiles are placed into the developer with the pixilated side facing up, developed for 2 minutes and the tile(s) are removed from the developer and rinsed in de-ionized water. The UV exposed resist is removed, in preparation for creating the interpixel gap.

In step 7 the remaining resist pixel pattern 314 is baked for 20 minutes at 90° C. This step is done to harden the resist further.

Figure 2G:
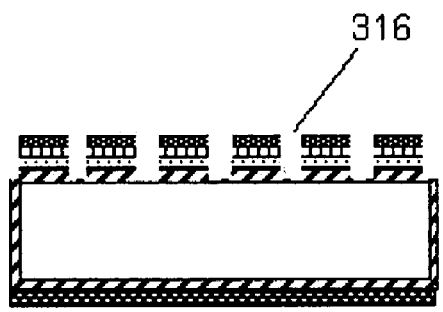

In step 8, shown in FIG. 2G, the exposed contact regions 316 (not covered by the pixel resist pattern 314) are etched. For the example contact materials, the following etching solution is suitable for etching through either just the primary contact layer or the optional three-layer contact. A 2% Br-Ethanol Glycol (BrEG) solution is prepared by pouring a 25 ml of Ethylene Glycol into a plastic beaker, then 0.5 ml of Bromine is added using a disposable pipette. Using the same pipette, the solution is mixed thoroughly until it becomes uniform. However, a different pipette or mixing device may also be used. Etching is conducted for approximately 3 minutes. This etching is done to remove unmasked interpixel contact material. To open the interpixel gap to achieve clean interpixel gaps, active spray agitation is performed. Disposable pipettes can be used to create Br-EG constant flow to agitate for better etching. However, a different pipette or agitation or mixing device may also be used. The spray etching technique should rapidly remove contact material flakes from the interpixel gaps, resulting in high interpixel resistance. The tiles are removed from the etchant and rinsed in deionized water.

Figure 2H:
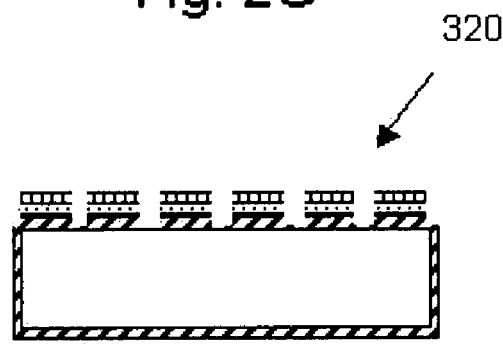

In step 9 shown in FIG. 2H, the remaining resist is stripped using an acetone bath, resulting in tile 320 with a pixel array of contacts. No photoresist therefore remains on the CdTe or CdZnTe detector since it is usually a hygroscopic material that in time would absorb humidity and deteriorate the detector performance.

The overall combination of depositing the metal layer over the entire substrate surface at once, direct photolithography and the etching process results in the improved device interpixel resistance and performance.

Figure 2I:
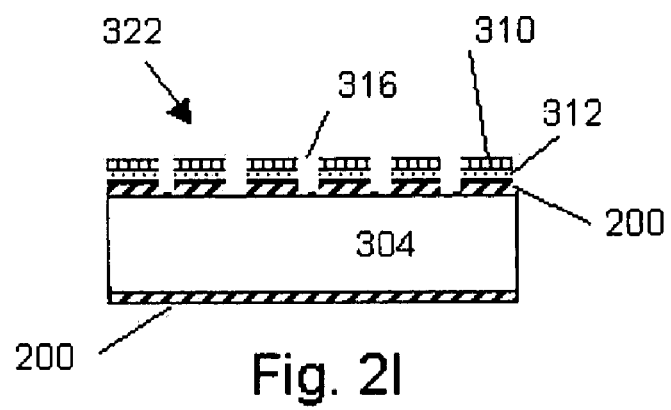

In step 10 shown in FIG. 2I, the primary contact material (in this example gold) on the sides of the fabricated CZT device 322 is removed by side polishing. For example, the side of the tile(s) are first polished with 1200 grit then with 0.3 micron as fine polish. An alternate embodiment could, in step 1, mask the sides of the CZT tile instead of depositing gold on all sides. For this reason, the side contact removal step 10 may be optional. The resulting fabricated CZT device has a cathode electrode 200 remaining on the front side, a pixilated anode electrode array formed of a primary contact layer 200, and secondary contact layers 312 and 310, separated by interpixel gaps 316. FIG. 2I illustrates the multi-layer pixels as being identical width in cross-section for illustrative purpose.

Figure 3A:
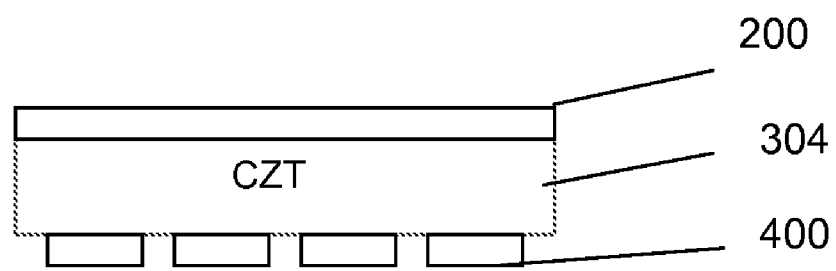
FIGS. 3A-D are schematic cross-sectional views of a method of making a detector with a housing.
Figure 3B:
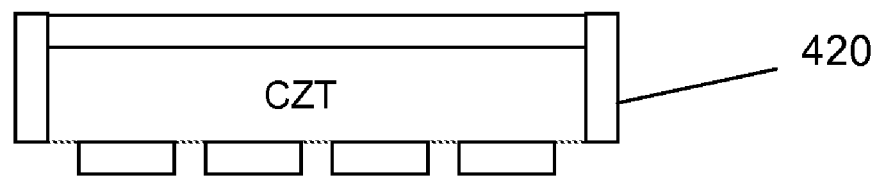

FIG. 3A shows the completed device containing the anode electrode pixels 400. Optionally, a protective coating 420 is applied to the polished side edges of the CZT tile as shown in FIG. 3B. For example, the CZT tile may be dipped in a protective coating (such as solder mask) to cover the exposed sides and dried for at least 5 hours.

The housing is preferably formed separately prior to attaching it to a radiation detector. Accordingly, the method of making the detector of one embodiment comprises (a) providing a radiation detector comprising a semiconductor substrate having opposing front and rear surfaces, a cathode electrode located on the front surface of said semiconductor substrate and a plurality of anode electrodes on the rear surface of said semiconductor substrate, (b) providing a separately formed electrically conductive housing, and (c) attaching the housing to the cathode electrode such that the housing and the cathode electrode are in electrical contact.

A non-limiting example of a method of particular embodiment is depicted in FIGS. 3A-3D showing side cross-sectional views of the detector at various stages of attaching a housing thereto. Starting with FIG. 3A, a radiation detector and its basic elements, cathode electrode 200, semiconductor substrate 304 and anode electrodes 400, are shown. The detector may or may not comprise at least one of a guard ring or screening electrode. Next, an optional protective coating (or solder mask) 420 is applied to edges of the substrate 304, as shown in FIG. 3B. Alternatively, this coating may be removed once a housing is formed thereon, resulting in an air gap between said housing and a side of the detector. Alternatively, this coating 420 is made of other electrically insulating materials, such as Humiseal.

Figure 3C:
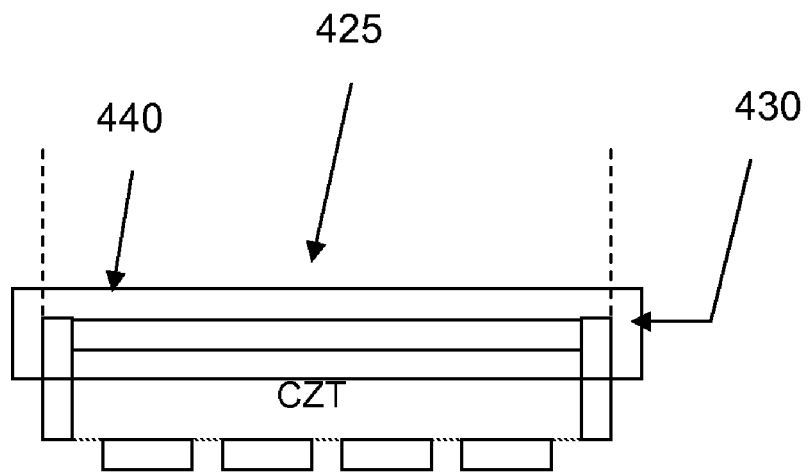

As shown in FIG. 3C, the electrically conductive housing is attached to the cathode and optionally the sides of the detector. In this illustration, the housing 425 comprises a top portion 440 and an optional side portion 430. The sides of the detector may or may not be glued to the protective coating (or solder mask) 420 covering sides of the detector depending on various reasons such as for example, if one wishes to later remove the protective coating. In this example, the housing is attached to the cathode via an epoxy, although one skilled in the art may chose from other adhesives.

The electrically conductive housing 425 shields the detector from background electromagnetic fields (or magnetic fields). Additionally, device electric fields are focused using this housing. The housing is also preferably transparent to X-ray or gamma-ray radiation. Further, the housing preferably exhibits little or no oxidation in ambient air, such as under normal operating conditions of the detector. As such, the housing is most preferably a thin structure and comprises a material transparent to radiation, substantially impervious to background electromagnetic fields and exhibits little or no oxidation at ambient conditions.

For example the housing may be between about 50 microns and 100 microns thick. In some cases a metal foil is sufficient as a housing.

Based on the parameters set forth above, one skilled in the art may chose from a host of materials for constructing the housing. In general, metals and metallic alloys are preferred. Any suitable metal which does not substantially oxidize in air may be used. A non-limiting example of suitable metallic alloys includes stainless steel, brass (such Ni/Ti coated brass), NiCo alloys, NiFe alloys, NiFeCo alloys, NiFeMo alloys or NiFeCuMo alloys. A class of metal alloys termed "Mu-metals" is most preferred. Mu-metals are a type of NiFe alloy, particularly effective at screening static or low frequency magnetic fields. In some cases, the aforementioned alloys may be doped with other alloying elements, mechanically pre-treated (e.g. cold worked, hot worked etc.), chemically surface-treated (e.g. surface coating for corrosion resistance) or any combination thereof.

In a particular embodiment, the housing for a radiation detector comprises a first means for electrically contacting a cathode electrode of a semiconductor radiation detector and a second means for shielding at least one side of a detector. For example, the first means may comprise the top portion 440 while the second means may comprise the side portion 430 of a housing 425. In some cases the side portion 430 extends over a fraction of the thickness of the semiconductor substrate, on at least one side. However, the side portion 430 may be omitted entirely. The top portion 440 is preferably shaped to make optimal electrical contact with a high voltage supply.

In some cases a flat top portion 440 is preferred. In another particular embodiment, the housing 425 is hemispherical or dome-shaped and partially or completely covers at least one side of the semiconductor substrate.

In some embodiments, the housing 425 is shaped to conform to geometry of the detector, more specifically, to geometry of the cathode, to which it is secured. Therefore, one skilled in the art may contemplate various curved or angular housing shapes given the shape of the detector. In a non-limiting example, the housing is a rectangular or circular-cross-sectioned (e.g. cylinder) shape.

When the housing is constructed to extend over (partially or completely) at least one side of the substrate, said at least one side is spaced from said housing. This gap is either empty or filled with an insulating material.

The housing 425 is attached to the cathode electrode 200 such that an electrical conduction path exists between the two. In a preferred case, the housing and the cathode are attached via an electrically conductive material. Most preferably, an electrically conducive polymeric material, such as a conductive epoxy applied to the inner face or surface of the housing is used.

Figure 3D:
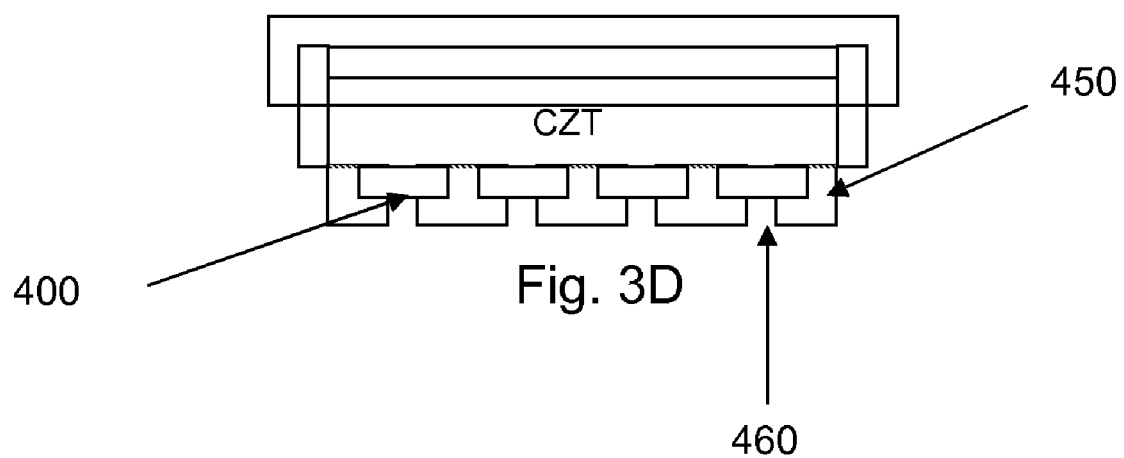

FIG. 3D illustrates an optional step where a solder mask 450 is disposed over the anode electrodes 400 providing mechanical protection while allowing external access to the electrodes. Further electrical isolation of the anode electrodes may be achieved with the solder mask 450 when the mask is formed between the anode electrodes 400 at the interpixel region.

Accordingly, a particular optional embodiment is directed to a radiation detector comprising a solder mask disposed above the anode electrodes in addition to the housing 425 contacting the cathode electrode 200. Solder masks 400 suitable for embodiments of the present application are described in U.S. application Ser. No. 11/642,819, filed on Dec. 21, 2006 which is hereby incorporated by reference in its entirely.

Preferably, the solder mask is photoimageable such that the portions of the solder mask 450 material over the anodes 400 are directly exposed to radiation, such as UV radiation, through a mask. The radiation either cross links or uncross links the exposed portions of the solder mask, depending on the type of epoxy used (i.e., analogous to a positive or negative photoresist). The uncross linked portions are then selectively etched away to form the openings 460 exposing a portion of the anode 400 surfaces. Alternatively, for a non-photoimageable solder mask material, a conventional photoresist mask formed over the solder mask may be used in the patterning step. The entire radiation detector device is covered with the solder mask except for the cathode and the anode regions exposed through the opening. Preferably, only a portion of each anode 400 is exposed in each opening 460 and no portion of the tile 304 is exposed. Thus, the solder mask is used as a protective coating (i.e., passivation/encapsulation agent) for protecting the entire radiation detector device.

As described in U.S. application Ser. No. 11/642,819, the radiation detector device comprising a solder mask may be connected to a readout printed circuit board (PCB), at the underfill filling locations located on the mating pad. The solder balls are placed in the openings 460 formed in the solder mask which serve as electrical interconnects between anodes 400 of the detector device and the conductor pads of the printed circuit board.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. All of the publications, patent applications and patents cited herein are incorporated herein by reference in their entirety.

What is claimed is:

1. A radiation detector, comprising:
a semiconductor substrate having opposing front and rear surfaces;
a cathode electrode located on the front surface of said semiconductor substrate;
a plurality of anode electrodes on the rear surface of said semiconductor substrate; and
an electrically conductive housing placed in electrical and physical contact with the cathode electrode.

2. The radiation detector of claim 1, further comprising a solder mask with openings disposed over the plurality of anode electrodes and on sides of the semiconductor substrate.

3. The radiation detector of claim 1, wherein the entire housing is transparent to X-ray or gamma-ray radiation.

4. The radiation detector of claim 3, wherein the housing is a unitary housing.

5. The radiation detector of claim 1, wherein the housing is between about 50 and about 100 microns thick.

6. The radiation detector of claim 1, wherein the housing shields the detector from electro-magnetic fields.

7. The radiation detector of claim 1, wherein the housing does not oxidize in ambient air.

8. The radiation detector of claim 1, wherein the housing comprises stainless steel, brass, a NiCo alloy, a NiFe alloy, a NiFeCo alloy, a NiFeMo alloy or a NiFeCuMo alloy.

9. The radiation detector of claim 1, wherein the housing comprises a Mu-metal.

10. The radiation detector of claim 1, wherein at least one side of the housing extends at least partially over a side of the substrate.

11. The radiation detector of claim 10, further comprising an air gap located between said at least one side of housing and the side of the substrate.

12. The radiation detector of claim 10, further comprising an insulator material located between said at least one side of housing and the side of the substrate.

13. The radiation detector of claim 1, further comprising an electrically conductive adhesive between the housing and the cathode electrode.

14. The radiation detector of claim 13, wherein the electrically conductive adhesive comprises an epoxy adhesive.

15. The radiation detector of claim 1, wherein the detector contains an array of pixels on a single semiconductor substrate.

16. A method of making a radiation detector with a housing, comprising:
providing the radiation detector comprising:
a semiconductor substrate having opposing front and rear surfaces;
a cathode electrode located on the front surface of said semiconductor substrate; and
a plurality of anode electrodes on the rear surface of said semiconductor substrate;
providing a separately formed electrically conductive housing, wherein the entire housing is transparent to X-ray or gamma-ray radiation; and
attaching the housing to the cathode electrode such that the housing and the cathode electrode are in electrical contact.

17. The method of claim 16, wherein at least one side of the housing extends at least partially over a side of the substrate.

18. The method of claim 17, further comprising an air gap located between said at least one side of housing and the side of the substrate.

19. The method of claim 17, further comprising an electrically insulating material located between said at least one side of housing and the side of the substrate.

20. The method of claim 16, wherein the housing comprises stainless steel, brass, a NiCo alloy, a NiFe alloy, a NiFeCo alloy, a NiFeMo alloy or a NiFeCuMo alloy.

21. The method of claim 16, wherein the housing comprises a Mu-metal.

22. The method of claim 16, wherein the housing and the cathode electrode are attached to each other via an electrically conductive adhesive.

23. The method of claim 22, further comprising applying a layer of the electrically conductive adhesive comprising an electrically conductive epoxy on an inner surface of the housing before the step of attaching the housing to the cathode electrode.

24. A radiation detector, comprising:
a semiconductor substrate having opposing front and rear surfaces;
a cathode electrode located on the front surface of said semiconductor substrate;
a plurality of anode electrodes on the rear surface of said semiconductor substrate; and
an electrically conductive housing placed in electrical contact with the cathode electrode, wherein the entire housing is transparent to X-ray or gamma-ray radiation.

25. The radiation detector of claim 24, further comprising a solder mask with openings disposed over the plurality of anode electrodes and on sides of the semiconductor substrate.

26. The radiation detector of claim 24, wherein the housing is between about 50 and about 100 microns thick.

27. The radiation detector of claim 24, wherein the housing shields the detector from electro-magnetic fields.

28. The radiation detector of claim 24, wherein the housing does not oxidize in ambient air.

29. The radiation detector of claim 24, wherein the housing comprises stainless steel, brass, a NiCo alloy, a NiFe alloy, a NiFeCo alloy, a NiFeMo alloy or a NiFeCuMo alloy.

30. The radiation detector of claim 24, wherein the housing comprises a Mu-metal.

31. The radiation detector of claim 24, wherein at least one side of the housing extends at least partially over a side of the substrate.

32. The radiation detector of claim 31, further comprising an air gap located between said at least one side of housing and the side of the substrate.

33. The radiation detector of claim 31, further comprising an insulator material located between said at least one side of housing and the side of the substrate.

34. The radiation detector of claim 24, further comprising an electrically conductive adhesive between the housing and the cathode electrode.

35. The radiation detector of claim 34, wherein the electrically conductive adhesive comprises an epoxy adhesive.

36. The radiation detector of claim 24, wherein the detector contains an array of pixels on a single semiconductor substrate and the housing is in physical contact with the cathode electrode.

* * * * *